US005481389A

United States Patent [19]

Pidgeon et al.

[11] Patent Number: 5,481,389
[45] Date of Patent: Jan. 2, 1996

[54] POSTDISTORTION CIRCUIT FOR REDUCING DISTORTION IN AN OPTICAL COMMUNICATIONS SYSTEM

[75] Inventors: Rezin E. Pidgeon, Atlanta; Heather H. Rand, Alpharetta, both of Ga.

[73] Assignee: Scientific-Atlanta, Inc., Norcross, Ga.

[21] Appl. No.: 958,976

[22] Filed: Oct. 9, 1992

[51] Int. Cl.[6] .................................................. H04B 10/08
[52] U.S. Cl. ........................... 359/161; 332/160; 375/296; 455/303; 359/195
[58] Field of Search .............................. 375/60; 359/190, 359/194, 195, 161; 332/160; 455/63, 114, 116, 303

[56] References Cited

U.S. PATENT DOCUMENTS

| 4,032,802 | 6/1977 | Pan | 307/311 |
|---|---|---|---|
| 4,045,675 | 8/1977 | Kingsley | 250/370 |
| 4,056,719 | 11/1977 | Waaben | 250/199 |
| 4,125,777 | 11/1978 | O'Brien | 250/551 |
| 4,282,604 | 8/1981 | Jefferson | 455/602 |
| 4,313,220 | 1/1982 | Lo | 455/305 |
| 4,316,141 | 2/1982 | Adolfsson | 324/96 |
| 4,345,482 | 8/1982 | Adolfsson | 73/862 |
| 4,378,496 | 3/1983 | Brogardh | 250/227 |
| 4,600,847 | 7/1986 | Baum | 455/602 |
| 4,613,811 | 9/1986 | Vaerewyck | 324/96 |
| 4,709,154 | 11/1987 | Rademaker | 250/551 |
| 4,992,754 | 2/1991 | Blauvelt | 330/149 |
| 5,172,068 | 12/1992 | Childs | 328/162 |
| 5,227,736 | 7/1993 | Tucker | 359/180 |

FOREIGN PATENT DOCUMENTS 0524758   1/1993   European Pat. Off. ............... 359/181

OTHER PUBLICATIONS

"Predistortion Linearization of Directly Modulated DFB Lasers and External Modulator for AM Video Transmission" Childs, et al., OFC '90.
"Feasibility of Multi-Channel VSB/AM Transmission on Fiber Optic Links", J. Koscinski, NCTA Technical Papers (1987), pp. 17–24.
"Linearization of Broadband Optical Transmission Systems by Adaptive Predistortion", M. Bertelsmeier, et al., Frequenz (1984) pp. 206–212.
"Linearization of Multichannel Analog Optical Transmitters by Quasi–Feedforward Compensation Technique", Patterson, et al., IEEE Transactions on Communications, vol. Com 27, No. 3 (Mar. 1979) pps 582–588.
"Phase–Shift Modulcation Technique for the Linearisation of Analogue Optical Transmitters", Strals, et al,. Electronics Letters, (Mar. 3, 1977, vol. 13, No. 5) pp. 149–151.
"Analog Transmission of TV–Channels on Optical Fibers, with Non–Linearities Correction by Regulated Feedforward," Franckart, et al., ECOC 83—9th European Conference on Optical Communication, Elsevier Science Publishers B.V., North Holland (1983) pp. 347–350.
"Linearization of Light Emitting and Laser Diodes for Analog Broadband Applications by Adaptive Predistortion", Bertelsmeier, et al,. Technical University, Merckstr, 25 D–6100 Darmstadt, DRF pp. 378–379.

(List continued on next page.)

Primary Examiner—Leslie Pascal
Attorney, Agent, or Firm—Banner & Allegretti, Ltd.

[57] ABSTRACT

A postdistortion network for a receiver at a receiver location in an optical transmission system is disclosed. The receiver converts an optical signal carried over an optical transmission link to an RF signal. The postdistortion network includes an input terminal for receiving the RF signal and a distortion generator for generating a distortion signal from the RF signal. An adjusting circuit for adjusts the phase and amplitude of the distortion signal based on distortion at said receiver location. The adjusted distortion signal is combined with the RF signal in order to cancel or substantially suppress distortion in the RF input signal. The present invention permits individual receivers in an optical transmission system to be compensated for distortion which may be unique to that receiver location. A communications system including a predistortion network and a postdistortion network is also disclosed.

5 Claims, 10 Drawing Sheets

OTHER PUBLICATIONS

"Nonlinearity and Its Compensation of Semiconductor Laser Diodes for Analog Intensity Modulcation Systems," Asatani, *IEEE Transaction on Communications,* (Feb. 1980), pp. 297–300.

"Linearisation of Optical Transmitters by a Quasifeedforward Compensation Technique," Straus, et al., *Electronics Letters,* (Mar. 17, 1977), vol. 13, No. 6) pp. 158–159.

"Linearization of LED Nonlinearity by Predistortions," Asatani, et al., *IEEE Transactions on Electronic Devices,* vol. ED–25, No. 2 (Feb. 1978) pp. 207–212.

"Status of 1550 nm Analog Fiber Optic systems and Performance Advantages," Pidgeon, et al., Technical Papers, SCTE Conference, Orlando, Fla. (Jan. 1991).

Josef Straus, "Linearized Transmitters for Analog Fiber Links", Laser Focus, vol. 14, No. 10, pp. 54–62, Oct. 1978.

POSTDISTORTION CIRCUIT FOR REDUCING DISTORTION IN AN OPTICAL COMMUNICATIONS SYSTEM

BACKGROUND OF THE INVENTION

1. Technical Field

The present invention generally relates to the linearization of nonlinear optical transmission systems by the generation of a compensation signal and, more particularly, to a method and apparatus for compensating the nonlinearities of an optical transmission system including at least one of a semiconductor laser, an optical amplifier, and an optical fiber communications link by the generation of a postdistortion signal.

2. Description of the Prior Art

Optical communications system which include a semiconductor laser, an optical fiber communication link, and an optical receiver are well known in the art. These communications systems are adapted to carry a wide range of information including voice, video and data.

The typical optical communications system includes a laser transmitter which transduces an electrical information signal into an optical signal. The optical signal is then carried over an optical fiber communications link where it is converted back to an electrical signal by a photodetector of an optical receiver. The transmission scheme may be analog or digital and the modulation scheme amplitude, phase, or frequency, or any combination of the above.

One of the most advantageous optical communication systems from the viewpoint of simplicity and bandwidth considerations is an analog scheme where the optical intensity of the semiconductor laser is amplitude modulated. The optical transmission system, including the semiconductor laser, optionally an optical amplifier, and optical fiber communications link is required to convert the electrical information signal linearly into an optical signal and to transmit the optical signal linearly over the communications link. In general, distortions caused by the semiconductor laser, the optical amplifier, and the fiber optic communications link cause the system to operate in less than an optimum manner. Increasingly, this type of optical communication system is playing an important role in the delivery of high quality signals in all types of CATV architectures.

Distortion in optical transmission systems can originate from several different sources. One of the primary sources is the electrical to optical transducer, a laser diode in most systems. Another contributor is the optical communications link and, more recently, any optical amplifier in the optical link. Some of these sources produce similar distortion signals which may even cancel others, but usually each distortion has its own unique characteristics and should be compensated for independently.

A laser diode generally exhibits distortion from several identifiable causes. The first is generally that caused by the non-linearities of its LI (light intensity as a function of electrical current) transfer function. The nonlinearity may be superlinear (L increases at increasing rates for increases in I), or it may be sublinear (L increases at decreasing rates for increases in i). This type of laser diode distortion causes mainly second order and higher intermodulation products that are independent of frequency. This type of distortion can be corrected by generating a distortion signal which is generally similar (sum and difference beats of the carrier frequencies) with a similar amplitude but opposite phase. Another characteristic distortion of the laser diode is where the amplitude and phase of the modulating signal is distorted as a function of frequency changes. To correct for such a distortion, a compensation signal which varies in amplitude and phase as a function of frequency is advantageous.

The distortion generated by an optical link is generally caused by phase and amplitude dispersion. Generally, phase dispersion causes the different modulating frequencies of an optical signal to be phase shifted different amounts. Phase dispersion is proportional to the length of the optical link and causes second order distortion with amplitude proportional to distortion frequency. Present optical communications systems use a 1330 nm. optical wavelength signal to minimize phase dispersion. However, newer systems that operate at a 1550 nm. optical wavelength are capable of minimizing amplitude signal losses but with effect of increasing phase dispersion. It would be advantageous to compensate for the increased phase dispersion of the 1550 nm. system while maintaining its lower optical loss. Optical amplifiers, particularly Erbium doped fiber amplifiers (EDFA), allow greater lengths of the optical fibers to be used but produce their own distortion in the form of an amplitude versus frequency characteristic.

One technique of compensating for distortion from the above-described sources utilizes a predistortion signal to compensate the RF signal modulating the laser transmitter for the distortion in the optical communications system. Such predistortion is discussed in commonly assigned, copending application Ser. No. 805,251 entitled "Method and Apparatus for Predistortion" and application Ser. No. 805,259 entitled "Method and Apparatus for Predistortion", which are incorporated herein by reference. However, predistortion networks cannot generally compensate for distortion which may be unique to a particular receiver or receiver location. For example, distortion caused by fiber dispersion is dependent upon fiber length and thus may be different at different receiver locations serviced by the same transmitter. Additionally, the receiver itself may introduce distortion which may vary from receiver to receiver.

SUMMARY OF THE INVENTION

It is an object of the present invention to provide compensation for distortion at a receiver location in an optical communications system.

It is another object of the present invention to provide compensation at a receiver location for distortion caused by modulation of a laser diode.

It is another object of the present invention to provide compensation at a receiver location for distortion generated by an optical amplifier.

It is another object of the present invention to provide compensation at a receiver location for distortion due to chromatic dispersion in an optical fiber.

It is another object of the present invention to provide an improved optical communication system for compensating distortion.

The present invention provides a postdistortion method and apparatus for the compensation of a nonlinear optical transmission system. In one preferred embodiment, the transmission system can be used for the carriage of a broadband television signal for a CATV system. The optical transmission system includes a semiconductor laser which acts as an electrical signal to optical signal transducer, optionally a fiber amplifier which increases the optical signal strength, and a fiber optic communications link which carries the optical signal to an optical receiver including a photodetector. The postdistortion method and apparatus includes a distortion generator which accepts the photodetector output and generates a distortion signal of the same general type as the distortion inherent in the optical transmission system.

In one preferred embodiment, the invention includes a direct path and a distortion path. An RF output of the photodetector, which may be a broadband multichannel CATV signal, is split between the direct path and the distortion path. The distortion path has a distortion generator fed by a portion of the output of the photodetector to produce a distortion signal essentially equivalent to that which is produced by the optical communications system. The distortion generated in the distortion path is then recombined with the signal in the direct path to produce a cancellation or substantial suppression of the distortion.

The present invention is adapted to compensate for the distortion caused by the modulation of a laser diode with an RF input signal with a multiplicity of carriers. In addition, it will compensate for distortion generated in an optical amplifier due to its variation in gain with respect to optical wavelength. Furthermore, the postdistortion network of the invention is particularly well-suited to compensate for distortion due to chromatic dispersion in the optical fiber. Since this distortion is dependent on the length of the fiber path from the transmitter to a receiver, its characteristics can vary from one receiver location to another. Since postdistortion is implemented at receiver locations, the postdistortion compensation signal may be adjusted to compensate for distortion conditions unique to that location.

According to one aspect of this embodiment, a square-law device is used to generate the distortion signal in the distortion generator. A square-law device generates composite second order (CSO) distortion without generating other tinwanted distortion products. CSO distortion in a particular channel is the total power of the separate sum and difference beats of the other channels falling within that channel. In one implementation of the invention, the square law device selected is a field effect transistor, such as a GaAsFET (Gallium Arsenide Field Effect Transistor), operated in the non-linear region near pinch off. A GaAsFET is chosen because of its good high frequency characteristics across the bandwidth of interest. In addition, because it is a voltage controlled device, the operating point of the device can be varied easily and precisely to generate the distortion characteristic desired. A device to invert of the phase of the distortion signal is further provided to produce the proper phase for cancellation of the system distortion.

In another embodiment of the invention, a distortion generator is utilized in a configuration which permits the cancellation of the fundamental frequency and the composite triple beat (CTB) component of the distortion. A triple beat is a third-order intermodulation product of two or three fundamental carriers which combine such as (f1+f2+f3), (f1+f2−f3), etc. and CTB is the composite of all the beat frequencies falling in a particular channel for a particular range of frequencies.

Another embodiment includes a plurality of distortion generators, at least one of which has provisions for generating and cancelling CTB distortion, and at least one of which has provisions for generating and cancelling CSO distortion.

The present invention also provides an optical communications system including a transmitter having a predistortion network and a receiver having a postdistortion network, thereby affording increased ability to compensate for distortion in the system.

BRIEF DESCRIPTION OF THE DRAWINGS

These and other objects, features and advantages of the present invention will be better understood from a reading of the following detailed description in conjunction with the accompanying drawings in which.

BRIEF DESCRIPTION OF THE PREFERRED EMBODIMENTS

Figure 1:
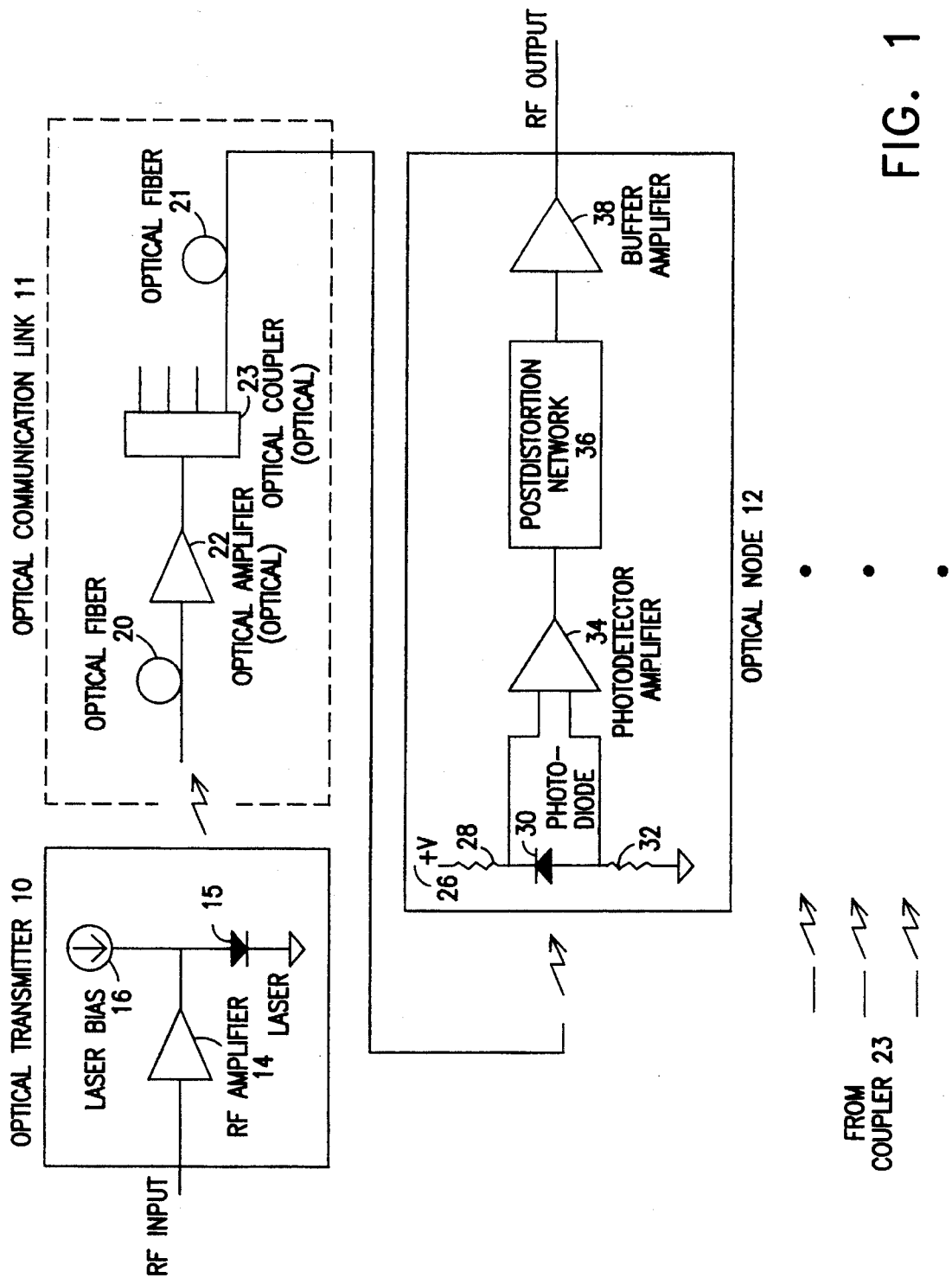
FIG. 1 is a system block diagram of an optical communications system including a postdistortion circuit in accordance with the present invention.

FIG. 1 is a system block diagram of an optical communication system in accordance with the present invention. The system includes an optical transmitter 10, an optical communications link 11, and one or more optical nodes 12. For clarity in the Figures, the details of one only optical node 12 are shown. The other nodes are similarly configured. The RF input to optical transmitter 10 may, for example, be a broadband CATV signal consisting of a plurality of frequency-division-multiplexed video carriers, although the invention is not limited in this respect. The RF input signal is amplified by RF amplifier 14, the output of which modulates the bias current in laser diode 15. The bias current is provided by a current source 16. Modulation of the laser current causes the intensity of the optical output to vary in a nearly linear fashion with respect to the input signal, The current source and amplitude of the modulation current are adjusted for optimum link carrier-to-noise and distortion performance.

The optical output from optical transmitter 10 is coupled to optical communications link 11 for transmission to one or more optical nodes. Optical communication link 11 includes optical fibers 20 and 21 and may optionally include an optical amplifier 22 and an optical coupler 23 for feeding a plurality of optical nodes.

Optical node 12 includes a photodetector 30, for example, a PIN photodiode, which transduces the intensity modulated signal into an amplitude modulated electric current signal. Photodetector 30 is reverse biased from a voltage source 26 through resistors 28 and 32. The photodetector output is amplified by photodetector amplifier 34, which may be a push-pull transimpedance amplifier or other suitable type designed for CATV applications. The RF output of photodetector amplifier 34 is processed by postdistortion compensation network 36 to reduce distortions generated from causes described above. The output of the postdistortion compensation network is amplified by buffer amplifier 38 for distribution to the CATV network.

Figure 2:
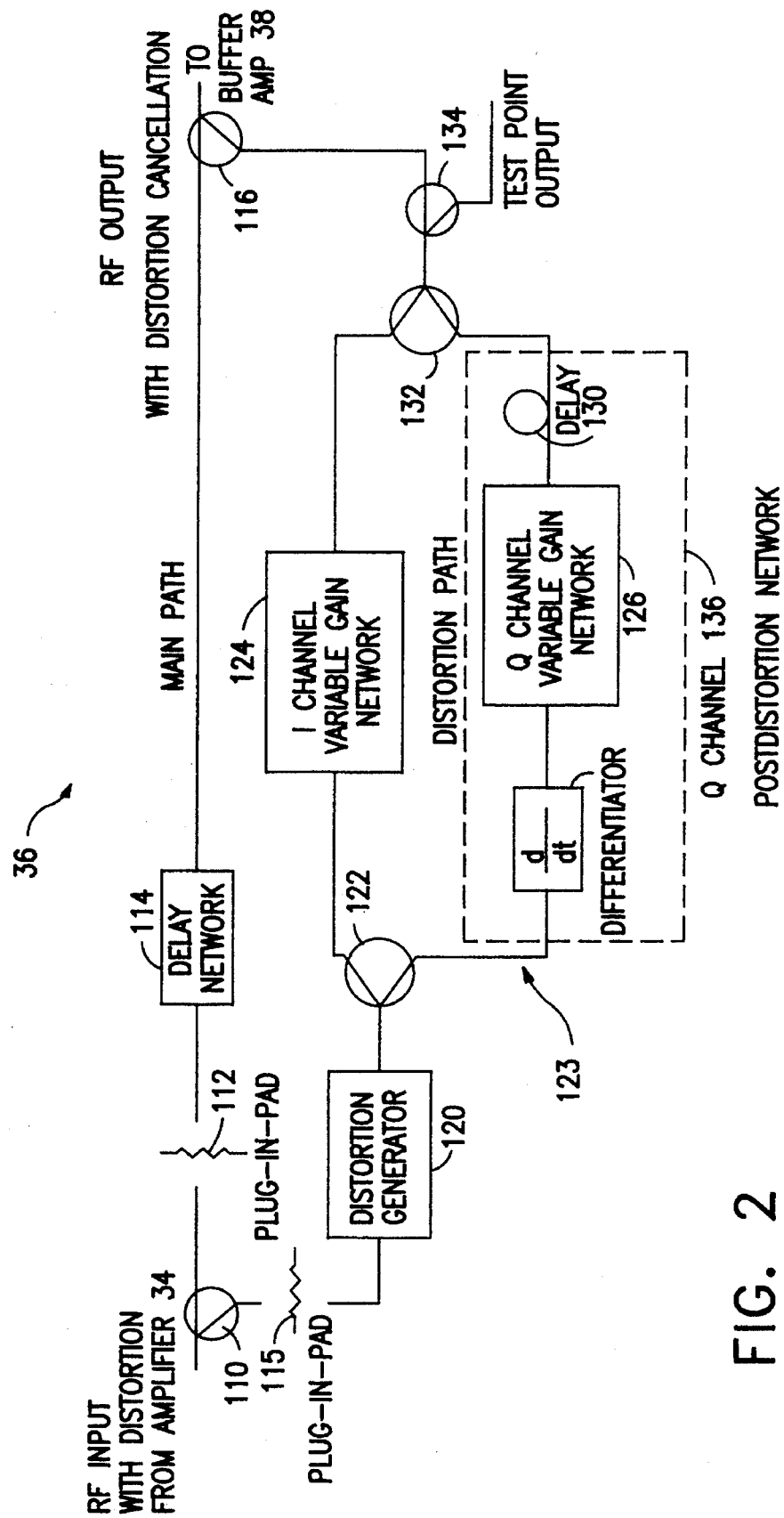
FIG. 2 is a block diagram of a first embodiment of the postdistortion circuit illustrated in FIG. 1.

FIG. 2 is a block diagram of one embodiment of the postdistortion compensation network 36 illustrated in FIG. 1. The RF input to postdistortion network 36 is the output from photodetector amplifier 34 of FIG. 1. The RF signal with distortion is split into two paths by directional coupler 110 with most of the output connected to a plug-in pad 112 in a first main path, and a smaller amount connected to a plug-in pad 115 in a second postdistortion path. The main path includes plug-in pad 112 and a delay network 114. Plug-in pad 112 is used to set the RF output level from the postdistortion network. Delay network 114, which may be a coaxial transmission line, distributed delay line, or other suitable delay network, provides a main path signal delay which is substantially equal to the time for a signal to pass through the postdistortion path.

The distortion path includes a plug-in pad 115, a distortion generator 120, directional couplers 122, 132, and 134, and a distortion signal adjustment network 123. Plug-in pad 115 is used to set the signal level to distortion generator 120 to optimize the output of the distortion generator with respect to the amplitude of the desired distortion, suppression of high-order distortion, and suppression of the broadband RF signal. The broadband RF signal with distortion passes from plug-in pad 115 to distortion generator 120. The purpose of distortion generator 120 is to generate intermodulation distortion, primarily second order (CSO), third order (CTB), or both, while substantially suppressing the undistorted broadband signal. The output of distortion generator 120 is provided to adjustment network 123 for adjusting the phase and amplitude of the distortion signal. Specifically, the output of distortion generator 120 is split by directional coupler 122 into two paths: an in-phase path which will be referred to as the I channel, and a 90-degree-shifted quadrature path which will be referred to as the Q channel. The I channel includes an I channel variable gain network 124 and the Q channel includes differentiator 126, Q channel variable gain network 128, and delay 130. The gain and phase of the signals in the I and Q channels are adjusted as described in greater detail below. The outputs of the I and Q channels are combined into a postdistortion compensation signal by directional coupler 132. Directional coupler 134 provides an output from the postdistortion path for test purposes. The postdistortion compensation signal from directional coupler 132 is combined with the RF input signal with distortion in the main path by directional coupler 116. With appropriate adjustments to the gain and phase of the signals in the I and Q channels, the combination of the RF input signal with distortion and the postdistortion compensation signal cancels or substantially suppresses the distortion from the RF input signal.

Figure 3A:
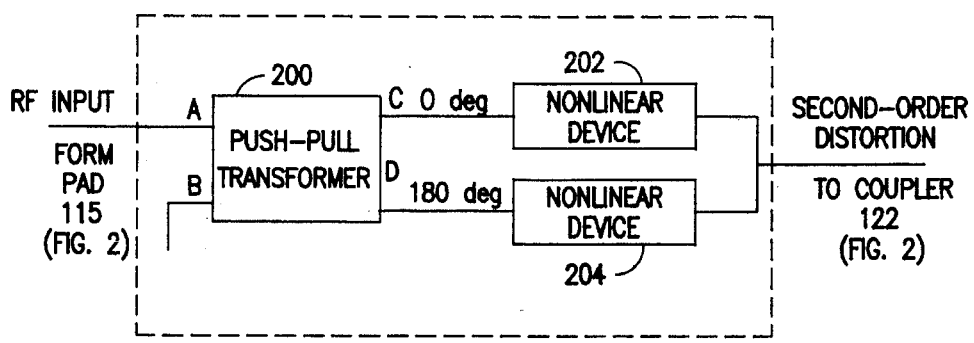
FIG. 3A is a block diagram of a first embodiment of a distortion generator for the postdistortion circuit of FIG. 2.

FIG. 3A is a block diagram of one embodiment of distortion generator 120 illustrated in FIG. 2. In particular, the distortion generator illustrated in FIG. 3A generates second-order (CS0) distortion and includes push-pull transformer 200 and first and second non-linear devices 202 and 204. First and second ports C and D of transformer 200 respectively provide out of phase signals to non-linear devices 202 and 204, which are preferably FET amplifiers. The outputs of non-linear devices 202 and 204 are combined such that the even ordered distortion components add and the odd ordered distortion components cancel.

Figure 3B:
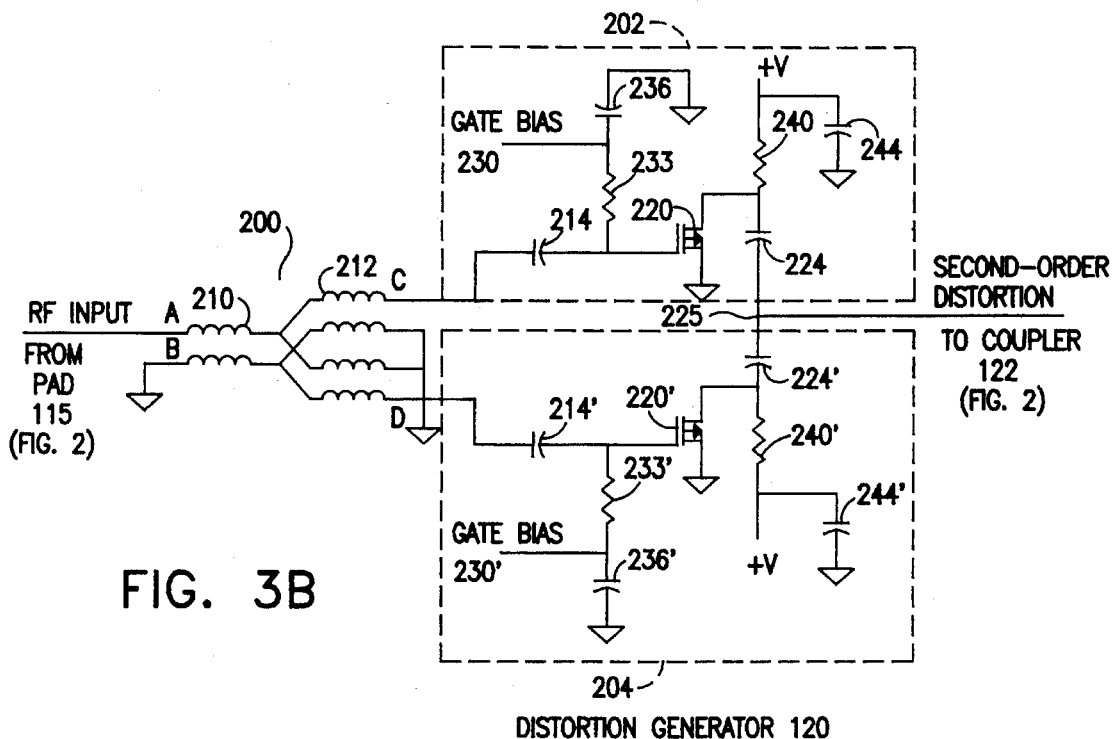
FIG. 3B is a schematic diagram of the distortion generator of FIG. 3A.

FIG. 3B is a schematic diagram of distortion generator 120 illustrated in FIG. 3A and the non-linear devices include respective field effect transistors 220 and 220'. The push-pull transformer 200 illustrated in FIG. 3A includes a balun 210 and a transformer 212 which provide a balanced output from the unbalanced RF input. A first output of transformer 212 is coupled to non-linear device 202 and a second output of transformer 212 is coupled to non-linear device 204. Non-linear device 202 includes a capacitor 214 coupled between the first output of transformer 212 and the control gate of FET 220. Resistor 233 and capacitor 236 are connected in series between a reference potential and a node between capacitor 214 and the control gate of FET 220. A gate bias is connected to a node between resistor 233 and capacitor 236. Capacitor 224 and resistor 240 are connected in series between output node 225 and a voltage source of a voltage +V. Capacitor 244 is connected between ground and a node between resistor 240 and the voltage source. The current terminals of transistor 220 are connected between ground and a point between capacitor 224 and resistor 240. Non-linear device 204 is similarly arranged and will not be discussed in detail.

The balanced output from transformer 212 is coupled through capacitors 214 and 214' to the gates of field effect transistors 220 and 220'. Resistors 233 and 233' are terminations for transformer 212. Field effect transistors 220 and 220' are biased from gate bias sources 230 and 230' to near pinch-off. In this region, the transistor drain current is a nonlinear function of gate voltage and can be described by the Curtice Cubic Model for field effect transistors. Accordingly, the drain current in transistor 220 can be expressed as $$I_{1\_ds} = a_0 + a_1 V_{gs} + a_2 V_{gs}^2 + a_3 V_{gs}^3$$

where $I_{1\_ds}$ is the drain current, $V_{gs}$ is the gate-source voltage, and $a_0$, $a_1$, $a_2$, and $a_3$ are constants in the nonlinear FET model. The gate-source voltage for FET 220' is the negative of the gate-source voltage of FET 220 since the field effect transistors are fed from a balanced source. Thus, the drain current in 220' can be expressed as $$I_{2\_ds} = a_0 + a_1(-V_{gs}) + a_2(-V_{GS})^2 + a_3(-V_{gs}^3)^3$$

The transistor outputs are connected in parallel to output terminal 225 through capacitors 224 and 224'. Summing the output currents gives $$I_{ds\_total} = 2a_2(V_{gs})^2$$

Thus, the linear broadband signal and odd-order CTB distortion is cancelled at the output of the transistors. Drain voltage for the transistors is supplied through resistors 240 and 240'. Capacitors 236, 236', 244, and 244' are RF bypass capacitors. The gate bias sources 230 and 230' may be adjusted for best balance to minimize the fundamental and odd-order-distortion components at the output of the distortion generator.

Transistors 220 and 220' are preferably GaAsFET devices because of their highly non-linear pinch-off region, common in many FETs, and their excellent high frequency characteristics across the CATV spectrum. The device is also precisely controllable to tailor the distortion generated by the gate voltage. Most FETs have a nonlinear region of their operating drive which is of use.

Figure 4A:
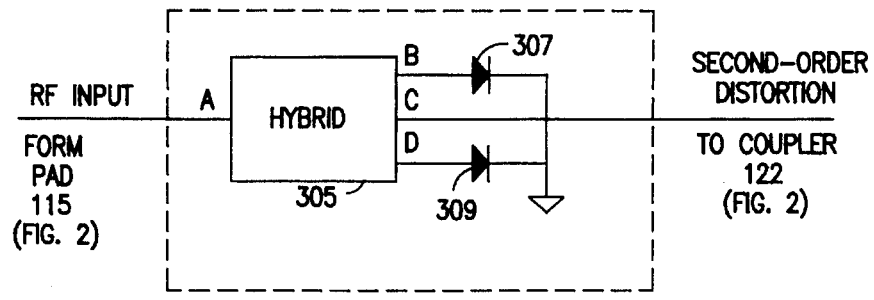
FIG. 4A is a block diagram of another embodiment of a distortion generator for the postdistortion circuit of FIG. 2.

FIG. 4A is a block diagram of a distortion generator 120' which may also be utilized in the present invention. In particular, the distortion generator illustrated in FIG. 4A generates second-order (CSO) distortion and includes hybrid transformer 305 and diodes 307 and 309, which diodes are respectively coupled to ports B and D of hybrid transformer 305. Distortion generated in the diodes is reflected to port C of hybrid transformer 305, which port constitutes the output of the distortion generator.

Figure 4B:
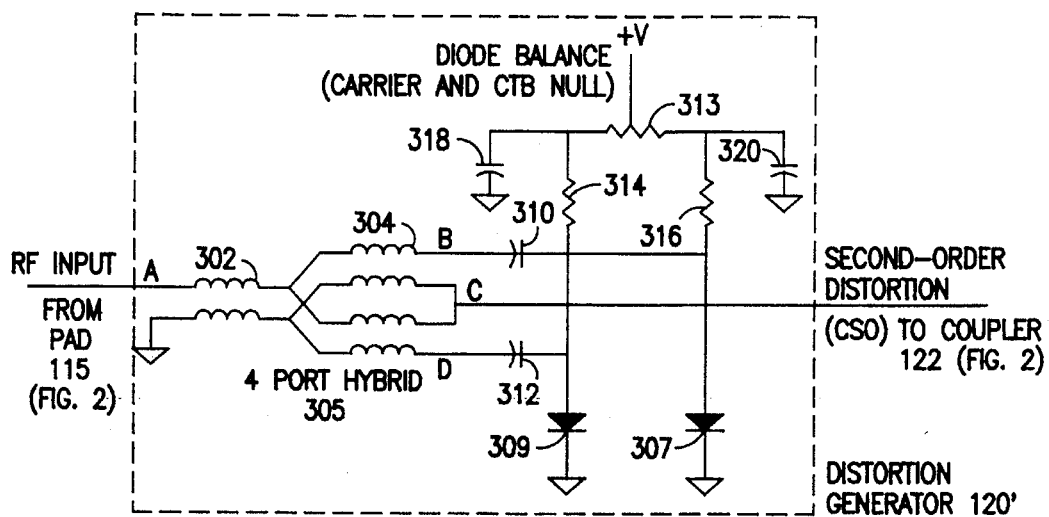
FIG. 4B is a schematic diagram of the distortion generator of FIG. 4A.

FIG. 4B is a schematic diagram of the distortion generator 120' illustrated in the block diagram of FIG. 4A. Transformers 302 and 304 form a 4-port hybrid with ports labeled A, B, C, and D. Port A receives the RF input from plug-in pad 115. Port C constitutes the output of distortion generator 120'. Port D is coupled to ground through capacitor 3 12 and diode 309. Port B is coupled to ground through capacitor 3 10 and diode 307. A first terminal of potentiometer 313 is connected to the anode of diode 309 through resistor 314. A second terminal of potentiometer 313 is connected to the anode of diode 307 through resistor 316. The first terminal of potentiometer 3 13 is coupled to ground through capacitor 318. The second terminal of potentiometer 313 is coupled to ground through capacitor 320.

The RF input is fed into port A of hybrid 305. The output of hybrid 305 is split equally between ports B and D with a 180-degree phase difference between the signals at ports B and D. Port C is isolated from port A, i.e., with ports B and D terminated, no power is coupled from port A to port C. Signals reflected from ports B and D add in phase at port C and out of phase at port A. Thus, the broadband input signal appears across diodes 307 and 309 but with a 180-degree phase difference. The current through the diodes is an exponential function of the voltage across the diodes. This diode nonlinearity causes harmonic and intermodulation currents in the diodes which are coupled to ports A and C of the hybrid. Because the diodes are driven anti-phase, the even-ordered distortion components reinforce at port C of the hybrid and cancel at port A. Odd-order distortion components cancel at port C and add at port A. Potentiometer 313 may be adjusted to minimize the amount of odd-order distortion, principally composite triple beat (CTB). Accordingly, the output of distortion generator 120' is second order (CSO) distortion.

Figure 5A:
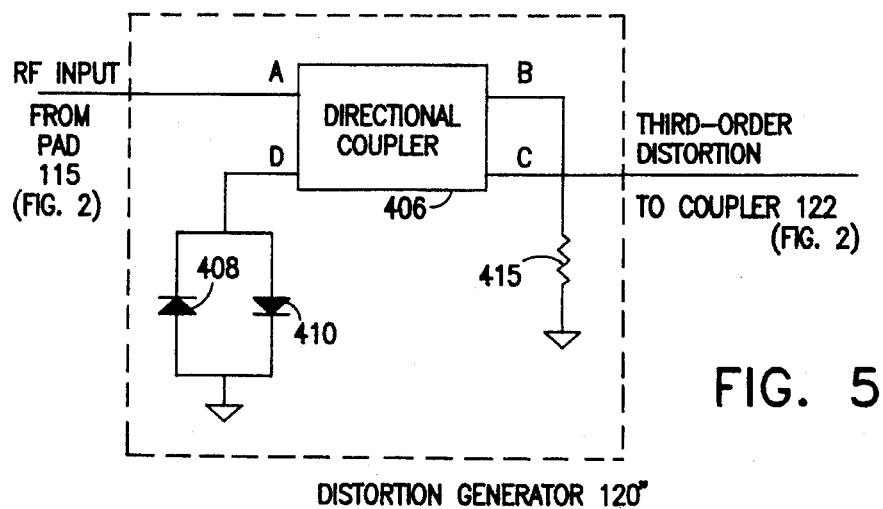
FIG. 5A is a block diagram of another embodiment of a distortion generator for the postdistortion circuit of FIG. 2.

FIG. 5A is a block diagram of a distortion generator 120" which may also be utilized in the present invention. In particular, the distortion generator illustrated in FIG. 5A generates third-order (CTB) distortion and includes directional coupler 406, diodes 408 and 410 coupled to port D of directional coupler 406, and resistor 415. Diodes 408 and 410 are connected in an opposed, parallel relationship between port D and a reference potential such as ground. Distortion is generated in the diodes 408 and 410 and reflected by directional coupler 406 to port C thereof, which port constitutes the output of the postdistortion generator. Resistor 415 provides a termination for port B of directional coupler 406.

Figure 5B:
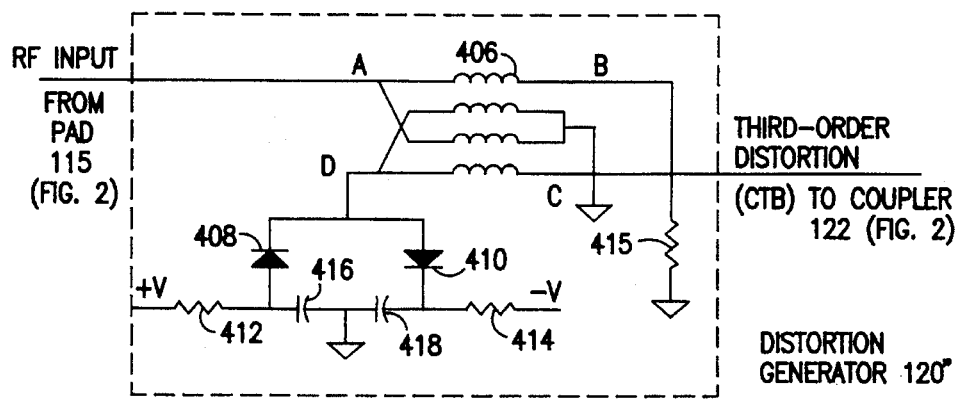
FIG. 5B is a schematic diagram of the distortion generator of FIG. 5A.

FIG. 5B is a schematic diagram of the distortion generator 120" illustrated in the block diagram of FIG. 5A. Directional coupler 406 includes ports A, B, C, and D. Port A receives the RF input from plug-in pad 115. Port B is coupled to ground through resistor 4 15. Port D of directional coupler 406 is coupled to the cathode of diode 408 and to the anode of diode 410. Resistor 412, capacitors 416 and 418 and resistor 4 14 are connected in series between voltages +V and −V. A point between capacitors 416 and 418 is coupled to ground. The anode of diode 408 is connected to a node between resistor 412 and capacitor 416 and the cathode of diode 410 is connected to a node between capacitor 418 and resistor 414.

Directional coupler 406, which may be a 12-dB coupler, couples the broadband RF input at port A to port B with a loss of approximately 0.5 dB and to the diodes 408 and 410 at port D with a loss of approximately 12 dB. Port C is isolated from input port A. The current through the diodes 408 and 4 10 is an exponential function of the voltage across the diodes. This diode nonlinearity causes harmonic and intermodulation currents in the diodes which are coupled to port A of the hybrid with a loss of 12 db and to port C with a loss of approximately 0.5 dB. Because the diodes are connected back-to-back, the diode current is an odd function of the diode voltage. Thus, even-order distortion components are cancelled and only odd-order distortion (CTB) components are reflected to the output of the distortion generator at port C of directional coupler 406. Diodes 408 and 410 are biased from voltage sources through resistors 412 and 414. The voltage sources may be adjusted to balance the diode characteristics and minimize the refection of the fundamental components and second-order-distortion to the output of the distortion generator. Capacitors 416 and 418 are RF bypass capacitors.

Figure 6:
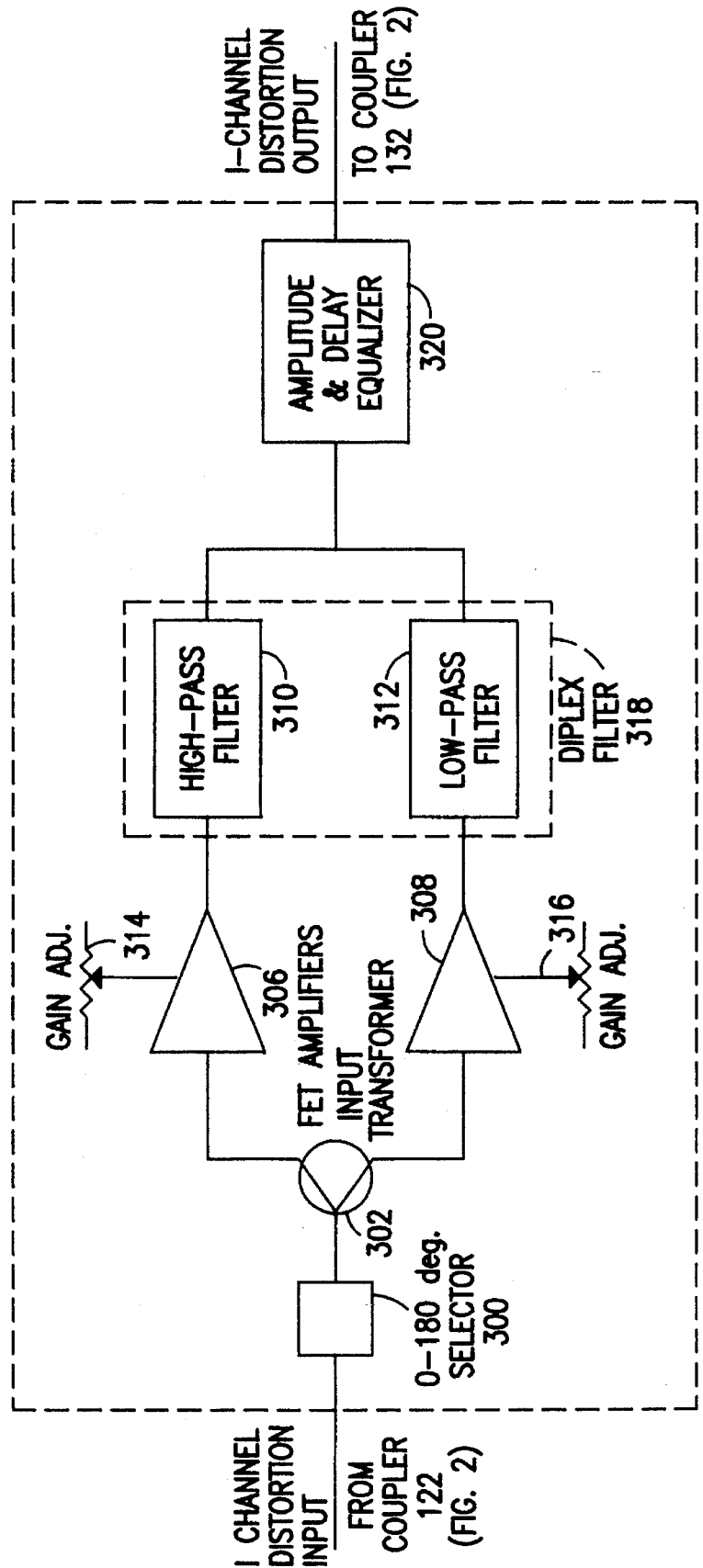
FIG. 6 is a block diagram of an embodiment of the I-channel variable-gain network of FIG. 2.

FIG. 6 is a block diagram of I-channel variable-gain network 124 illustrated in FIG. 2. I-channel variable-gain network 124 includes phase selector 300, directional coupler 302, amplifiers 306 and 308 with corresponding gain adjustments 314 and 316, diplex filter 318 including high pass filter 310 and low pass filter 312, and an amplitude and delay equalizer circuit 320. Distortion from the distortion generator is coupled through directional coupler 122 of FIG. 2 to the 0–180 degree phase selector network 300. Phase selector network 300 is used to select a phase appropriate for compensating the distortion in the RF input signal. The output of phase selector network 300 is supplied to a 3-dB coupler 302. The output of coupler 302 feeds in antiphase the high-pass and low-pass sections of the I-channel network. Because of the complex nature of the distortion mechanisms described previously, the composite distortion will in general vary in magnitude and phase as a function of the channel frequency. Accordingly, independent gain adjustments 314 and 316 for amplifiers 306 and 308, respectively, allow for independent adjustment of distortion at high channels and low channels.

The output of the high-pass and low-pass sections are combined at the output of the diplex filter 318 which is comprised of high-pass filter 310 and low-pass filter 312. Diplex filter 318 is of a Butterworth design. The Butterworth filter has the characteristic that the phase versus frequency characteristic of the high-pass and low pass sections is identical except for an offset of 90 degrees times the filter order. The diplex filter as shown in FIG. 6 is of order 2. Thus, the antiphase inputs from directional coupler 302 add in phase at the output of the diplex filter. As a result of the Butterworth characteristic, the gain of the high- and low-channels can be changed without changing the phase at the output. In this implementation, a linear phase characteristic is obtained for the I-channel with independent high- and low-channel gain adjustments. Amplitude and delay equalizer circuit 320 enables a flat amplitude and linear phase response to be obtained. The delay equalizer equalizes primarily for the characteristic delay of the Butterworth filter. The amplitude equalizer equalizes for the 3-dB increase in gain at the cross-over frequency of the diplex filter.

Figure 7:
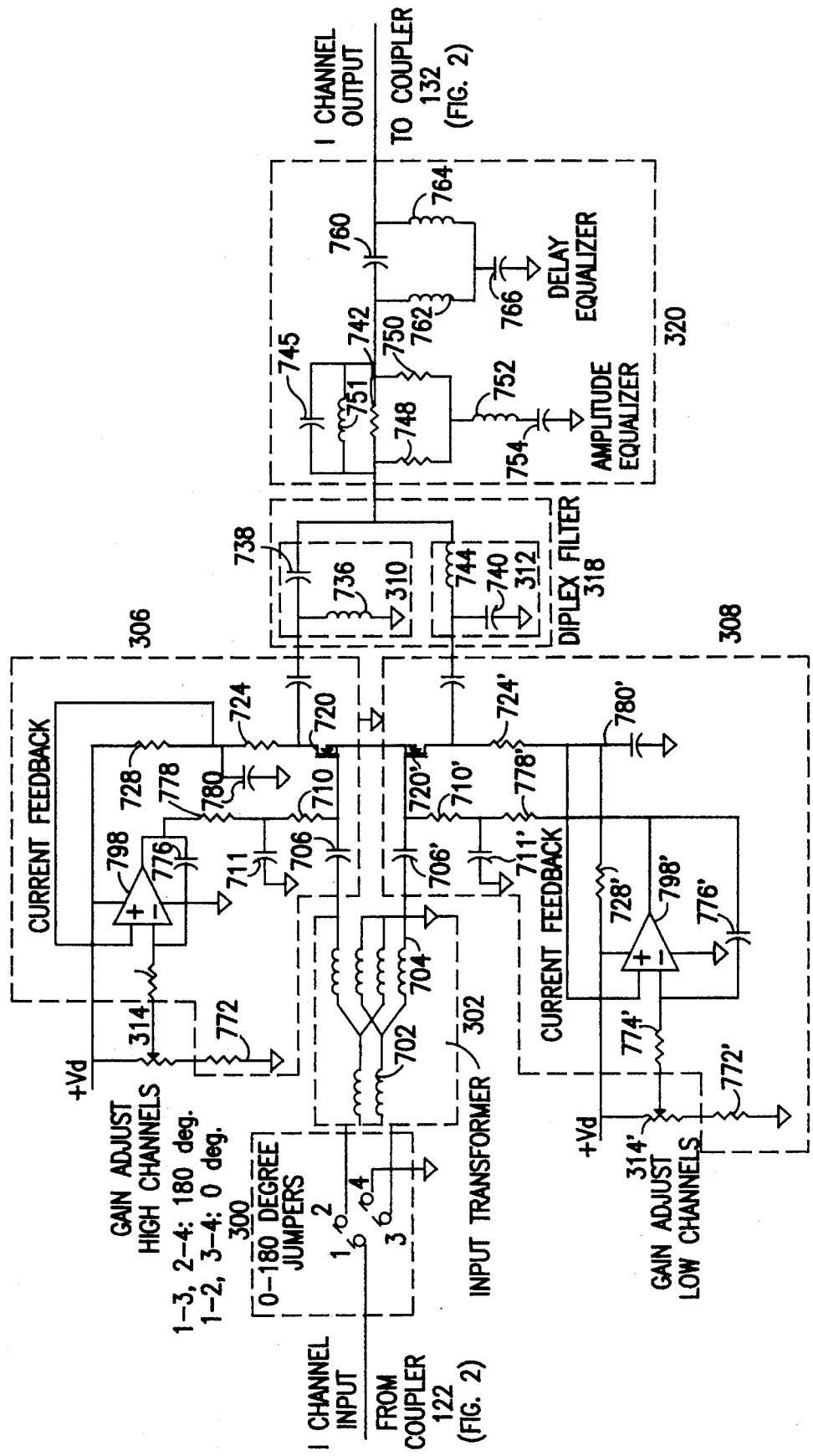
FIG. 7 is a schematic diagram of the I-channel variable-gain network of FIG. 6.

FIG. 7 is a detailed schematic of the I-channel variable gain network illustrated in FIG. 6. The I-channel input from the distortion generator via directional coupler 122 is connected to a jumper or switch assembly which allows the I-channel output to be switched between 0 and 180 degrees as necessary for cancellation of the optical-link distortions. When terminal 1 is jumpered to terminal 3 and terminal 2 is jumpered to terminal 4, the phase of the I channel input is shifted 180 degrees. When terminal 1 is jumpered to terminal 2 and terminal 3 is jumpered to terminal 4, the phase of the I channel input is not shifted. Transformer 302 includes a balun 702 and a 4:1 impedance transformer 704 which provide a balanced input to the FET amplifiers. A first output of transformer 302 is coupled to the control gate of field effect transistor 720 through capacitor 706. One current terminal of transistor 720 is coupled to ground and the second terminal is coupled to a power supply +Vd through resistors 724 and 728. Capacitor 780 is coupled between ground and a point between resistors 724 and 728. The output of amplifier 798 is coupled to the control gate of transistor 720 through resistors 778 and 710. Capacitor 711 is coupled between ground and a point between resistors 778 and 710. The output of amplifier 798 is coupled to the inverting input terminal of the amplifier through capacitor 776. The non-inverting input of amplifier 798 is connected to a point between resistors 724 and 728. A contact of gain adjusting potentiometer 314 is coupled to the inverting terminal of amplifier 798 through resistor 774. Potentiometer 314 and resistor 772 are connected in series between the power source +Vd and ground. Amplifier 798 is connected to power supply +Vd and the ground potential. FET amplifier 308 is similarly configured and not discussed in detail here.

The gain of the field effect transistors is controlled by current-feedback loops. The gains are controlled by the setting of the gain adjustment potentiometers 314 and 314'. The voltage across resistors 728 and 728' is compared with the voltage across potentiometers 314 and 314', and the error voltage is amplified by amplifiers 798 and 798'. This error voltage is fed through resistors 778, 710 and 778' and 710' to the gates of transistors 720 and 720' to regulate the transistor drain currents and gains. Resistors 710 and 710' provide the resistive termination for transformer 704. Capacitors 706 and 706' are coupling capacitors. Capacitors 776 and 776' set the time constant of the current-feedback loops. Capacitors 711, 711', 780, and 780' are by-pass capacitors.

The output of the amplifier stages 306 and 308 add in-phase at the output of the diplex filter 318. Diplex filter 318 includes a low-pass section 312 with a capacitor 740 and an inductor 744 and a high-pass section 310 with an inductor 736 and a capacitor 738.

The amplitude equalizer of circuit 320 is a bridge-T equalizer including resistors 742, 748, and 750, inductors 751 and 752, and capacitors 745 and 754. Inductor 751 and capacitor 745 are respectively connected in parallel across the terminals of resistor 742. The first terminal of resistor 742 is connected to ground through resistor 748, inductor 752 and capacitor 754. The second terminal of resistor 742 is connected to ground through resistor 750, inductor 752 and capacitor 754. The amplitude equalizer equalizes for the 3-dB increase in gain at the cross-over frequency of diplex filter 318.

The delay equalizer of circuit 320 equalizes for the characteristic delay of the Butterworth filter and amplitude equalizer and includes capacitors 760 and 766 and inductors 762 and 764. Capacitor 760 is connected between the output of the amplitude equalizer and the I channel output. A first terminal of capacitor 760 is connected to ground through inductor 762 and capacitor 766 and a second terminal of capacitor 760 is connected to ground through inductor 764 and capacitor 766.

Figure 8:
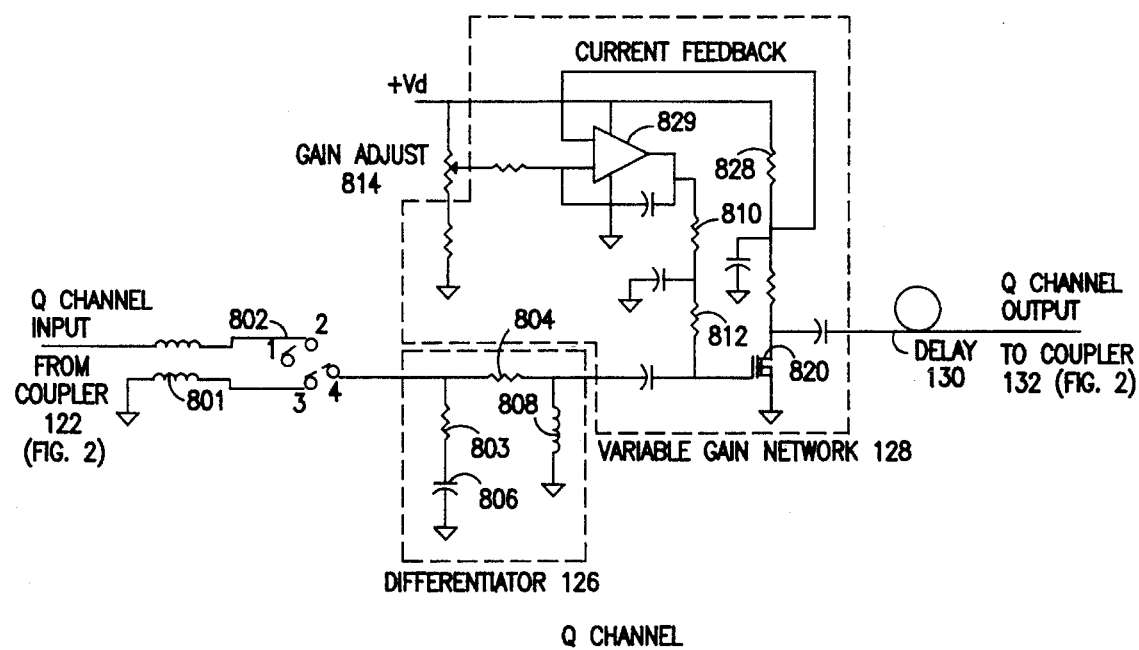
FIG. 8 is a schematic diagram of one embodiment of the Q-channel variable-gain network of FIG. 2.

FIG. 8 is a detailed schematic of Q channel 136 illustrated in FIG. 2. The Q-channel input from the distortion generator is supplied to balun 801 and then to a selector network 802 comprising a jumper or switch assembly to enable the Q-channel output to be switched between 90 and 270 degrees. Adding the output of the variable-gain Q channel of phase 90 or 270 degrees with the output of the variable-gain I-channel of phase 0 or 180 degrees enables the output distortion to be adjusted in magnitude and phase over a 360-degree range as necessary for cancellation of the optical-link distortions.

The output of selector network 802 is differentiated by differentiator 126 which causes a 90-degree phase lead in the distortion components. Resistor 804 and inductor 808 differentiate the signal. Resistor 803 and capacitor 806 provide a complementary input admittance so that the input impedance to the differentiator is a constant resistance. The output of the differentiator 126 is amplified by FET 820 in the variable gain network 128. The arrangement of components in variable gain network 128 is substantially the same as the arrangement of components of amplifier 304 and will not be discussed in detail here. In short, the gain of FET 820 is controlled by a conventional current-feedback loop in manner similar to that in the I-channel. The gain is controlled by the setting of the gain adjustment potentiometer 814. The voltage across resistor 828 is compared with the voltage across potentiometers 814, and the error voltage is amplified by operational amplifier 829. This error voltage is fed through resistors 810 and 812 to the gate of the FET 820 to regulate the FET drain current and gain. Delay 130, which might be provided by a coaxial line, or distributed or printed delay line, adds a signal delay to the Q channel to match the total signal transit time through the I-channel.

Figure 9:
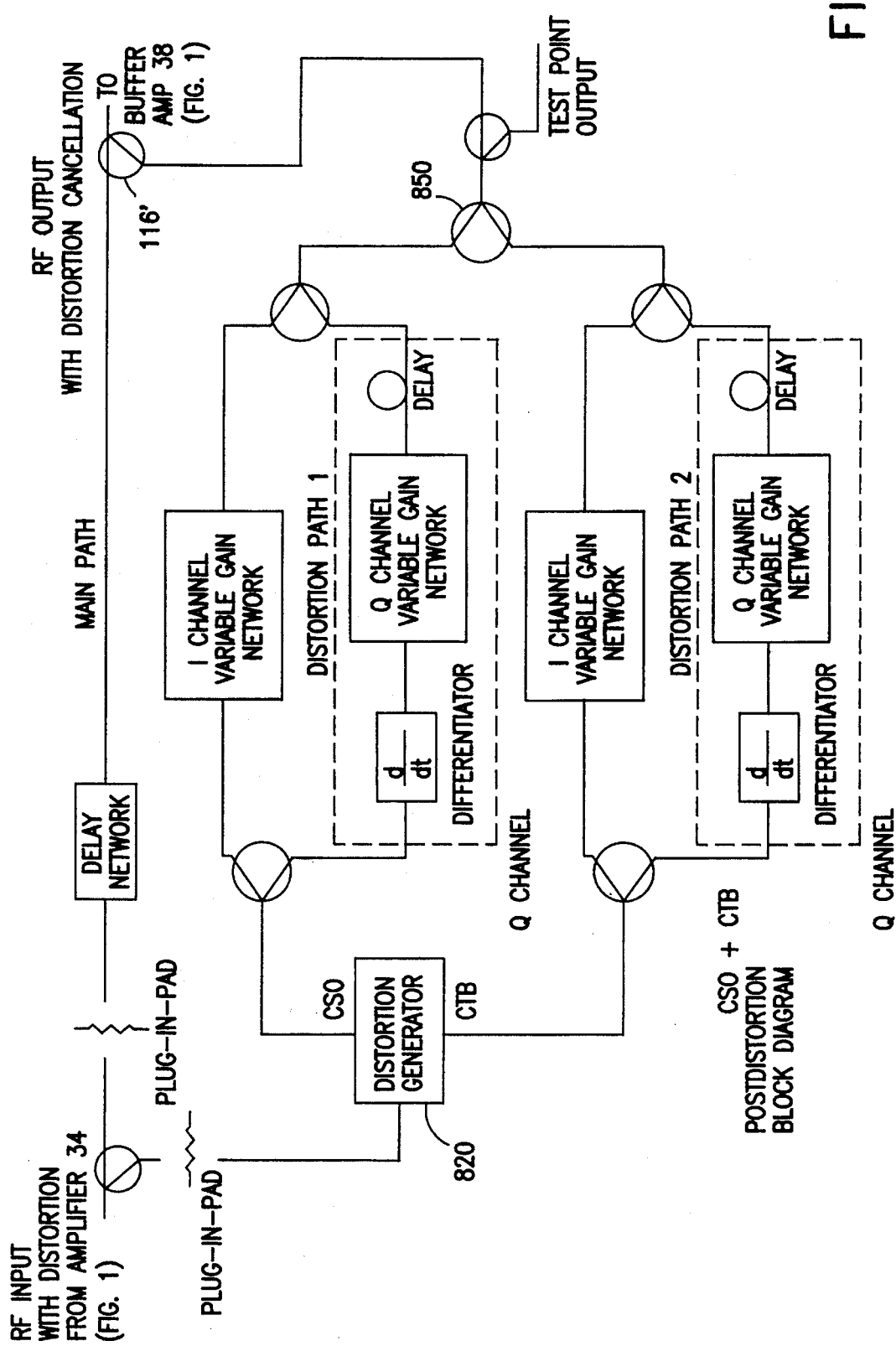
FIG. 9 is a block diagram of another embodiment of the postdistortion circuit illustrated in FIG. 1 used to cancel multiple orders of distortion.

FIG. 9 is a block diagram of an embodiment of the postdistortion network 36 illustrated in FIG. 1 for cancelling multiple-orders of distortion, primarily CSO and CTB. The postdistortion network of FIG. 9 includes a distortion generator 820 for generating second and third order distortion. The distortion path includes a first distortion path for the second order distortion components and a second distortion path for the third order distortion components. The respective outputs of the adjusting networks in each of these paths is combined by directional coupler 850. The postdistortion compensation signal from directional coupler 850 is combined with the RF input signal with distortion at directional coupler 116'. The details of this arrangement are apparent from the discussion above and will not be repeated here.

Figure 10:
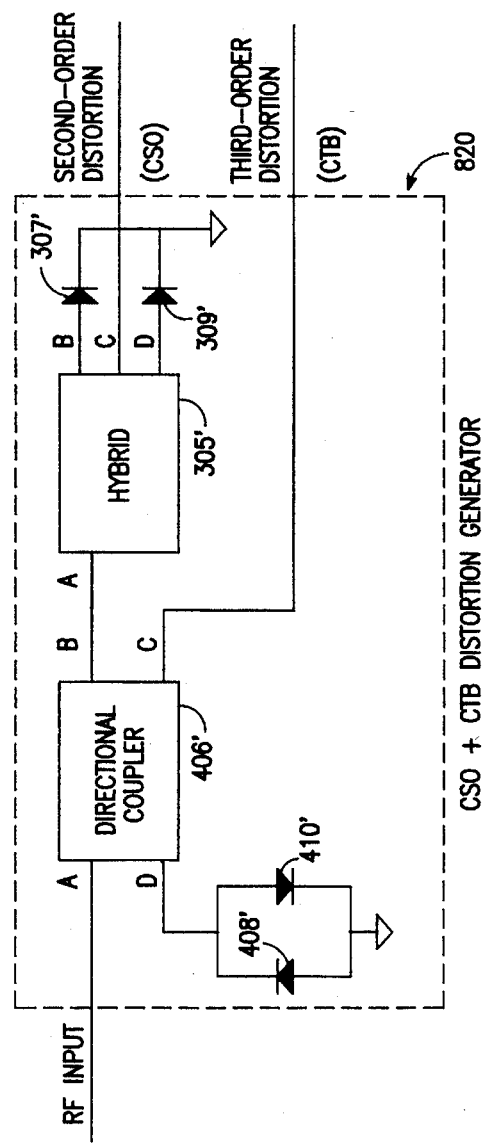
FIG. 10 is a block diagram of an embodiment of the distortion generator of FIG. 9.

FIG. 10 is a block diagram of one embodiment of distortion generator 820 illustrated in FIG. 9 for generating second-order (CSO) and third-order (CTB) distortion. It is apparent that distortion generator 820 consists of connecting port A of the distortion generator illustrated in FIG. 4A to the port B of the distortion generator of FIG. 5A. The RF input at port A of directional coupler 406' is coupled to port B with a loss of approximately 0.5 dB. The theory of operation of this circuit is evident from the above discussions of FIGS. 4B and 5B.

Figure 11:
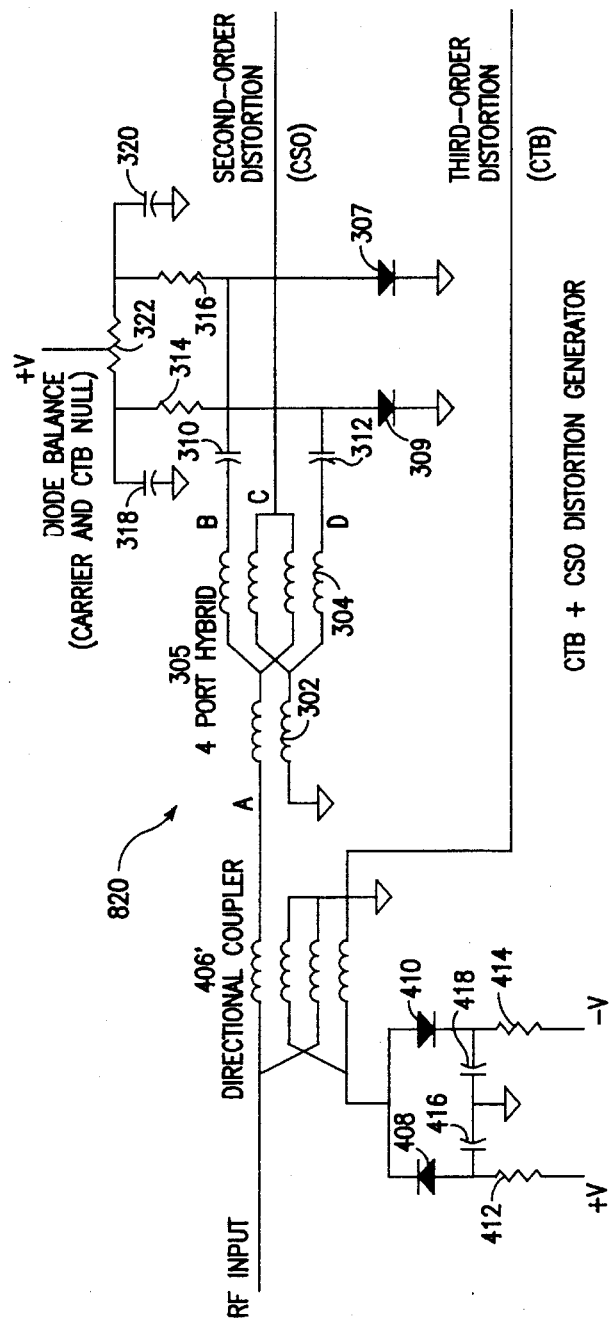
FIG. 11 is a schematic diagram of the distortion generator of FIG. 10.

FIG. 11 is a schematic diagram of the distortion generator 820 illustrated in the block diagram of FIG. 10. Again, it is apparent that distortion generator 820 is obtained by connecting port A of the distortion generator of FIG. 4B to port B of the distortion generator illustrated in FIG. 5B. The theory of operation of this circuit is evident from the above discussions of FIGS. 4B and 5B.

Figure 12:
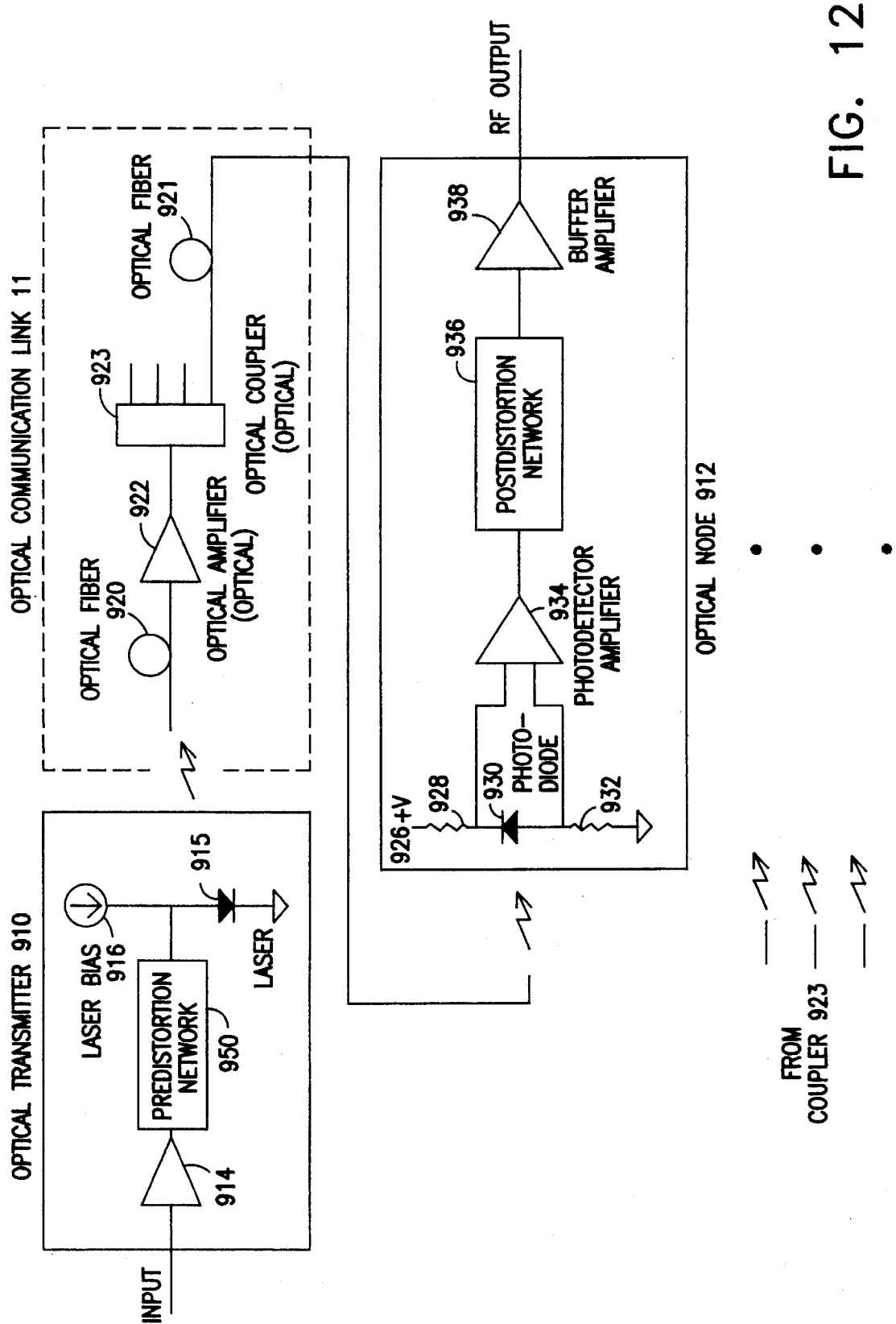
FIG. 12 is a system block diagram of an optical communications system in accordance with another embodiment of the present invention.

FIG. 12 is a system block diagram of an optical communication system in accordance with another embodiment of the present invention. The system includes an optical transmitter 910, an optical communications link 911, and one or more optical nodes 912. For clarity in the Figures the details of only one optical node 912 are shown. The other nodes are similarly configured. The RF input to optical transmitter 910 may, for example, be a broadband CATV signal consisting of a plurality of frequency-division-multiplexer video carriers, although the invention is not limited in this respect. The RF signal is amplified by RF amplifier 914 and provided to predistortion network 950. Predistortion network 950 generates a predistortion signal to compensate the RF signal modulating the laser diode for distortion which will be generated in the communication system. Predistortion network 950 may be constructed, for example, as shown in commonly assigned application Ser. Nos. 805,251 and 805,259 or as shown in FIGS. 9 and 10 above. The output of predistortion network 950 modulates the bias current in laser diode 915. The bias current is provided by a current source 916. Modulation of the laser current causes the intensity of the optical output to vary in a nearly linear fashion with respect to the input signal. The current source and amplitude of the modulation current are adjusted for optimum link carrier-to-noise and distortion performance.

The optical output from optical transmitter 910 is coupled to optical communications link 911 for transmission to one or more optical nodes. Optical communication link 911 includes optical fibers 920 and 921 and may optically include an optical amplifier 922 and an optical coupler 923 for feeding a plurality of optical nodes.

Optical nodes 912 includes a photodetector 930, for example, a PIN photodiode, which transduces the intensity modulated signal into an amplitude modulated electric current signal. Photodetector 930 is reverse biased from a voltage source 926 through resistor 928 and 932. The photodetector output is amplified by photodetector amplifier 934, which may be a push-pull transimpedance amplifier or other suitable type designed for CATV applications. The RF output of photodetector amplifier 934 is processed by postdistortion compensation network 936 to reduce distortions, which may, for example, be unique to a receiver location. The output of the postdistortion compensation network is amplified by buffer amplifier 938 for distribution to the CATV network. It will be apparent that an optical communications system constructed in accordance with the above teachings offers increased capabilities for compensating for distortion.

While there has been shown and described the preferred embodiments of the invention, it will be evident to those skilled in the art that various modifications may be made thereto without departing from the spirit and scope of the invention which is set forth in the appended claims.

We claim:

1. A postdistortion network for a receiver at a receiver location in an optical communications system, said receiver converting an optical signal carried over the optical communications system to an RF signal, said postdistortion network comprising:

an input terminal for receiving the RF signal;

a distortion generator for generating a distortion signal from the RF signal;

adjusting means for adjusting the phase and amplitude of the distortion distortion at said receiver location; and combining means for combining the adjust distortion signal with the RF signal to cancel or substantially suppress distortion in said RF signal, wherein said distortion generator comprises a distortion generator for generating third order distortion, and wherein said distortion generator for generating third order distortion comprises:

a directional coupler having a first port for receiving said RF signal and coupling a portion of said RF signal to a third port;

a diode circuit for generating said third order distortion and including a first diode having an anode coupled to said third port and a cathode coupled to a reference potential and a second diode having a cathode coupled to said third port and an anode coupled to the reference potential, wherein said distortion generated by said diode circuit is output at a second port of said directional coupler.

2. The postdistortion network according to claim 1, wherein said distortion generator further comprises a distortion generator for generating second order distortion.

3. The postdistortion generator according to claim 2, wherein said distortion generator for generating second order distortion comprises:

a transformer having an input coupled to said input terminal and first and second outputs for respectively outputting a first transformer output and a second transformer output out-of-phase with the first transformer output;

a first non-linear device receiving said first transformer output;

a second non-linear device receiving said second transformer output; and combining means for combining outputs of said first and second non-linear devices.

4. The postdistortion network according to claim 3, wherein said first and second non-linear devices comprise field effect transistor amplifiers.

5. The postdistortion network according to claim 2, further comprising:

circuitry for independently adjusting the phase and gain of said second and third order distortion.

* * * * *